(12) United States Patent
Healey

(10) Patent No.: US 8,949,081 B2
(45) Date of Patent: Feb. 3, 2015

(54) METHOD FOR COMPUTING COOLING REDUNDANCY AT THE RACK LEVEL

(75) Inventor: Christopher M. Healey, Chelmsford, MA (US)

(73) Assignee: Schneider Electric IT Corporation, West Kingston, RI (US)

(*) Notice: Subject to any disclaimer, the term of this patent is extended or adjusted under 35 U.S.C. 154(b) by 639 days.

(21) Appl. No.: 12/974,719

(22) Filed: Dec. 21, 2010

(65) Prior Publication Data

US 2012/0158375 A1 Jun. 21, 2012

(51) Int. Cl.
G06F 17/10 (2006.01)
H05K 7/20 (2006.01)
G06F 1/20 (2006.01)

(52) U.S. Cl.
CPC ............. *H05K 7/20836* (2013.01); *G06F 1/20* (2013.01)
USPC ........................................................ 703/2

(58) Field of Classification Search
USPC ........................................................ 703/6, 2
See application file for complete search history.

(56) References Cited

U.S. PATENT DOCUMENTS

| | | | |
|---|---|---|---|
| 7,031,870 B2 | 4/2006 | Sharma et al. |
| 7,051,946 B2 | 5/2006 | Bash et al. |
| 7,197,433 B2 | 3/2007 | Patel et al. |
| 7,313,503 B2 | 12/2007 | Nakagawa et al. |
| 7,558,649 B1 | 7/2009 | Sharma et al. |
| 7,568,360 B1 | 8/2009 | Bash et al. |
| 7,596,476 B2 | 9/2009 | Rasmussen et al. |
| 7,881,910 B2 | 2/2011 | Rasmussen et al. |
| 7,885,795 B2 | 2/2011 | Rasmussen et al. |
| 7,908,126 B2 | 3/2011 | Bahel et al. |
| 8,244,502 B2 | 8/2012 | Hamann et al. |
| 8,425,287 B2 | 4/2013 | Wexler |
| 8,473,265 B2 | 6/2013 | Hlasny et al. |
| 8,509,959 B2 | 8/2013 | Zhang et al. |
| 2003/0158718 A1 | 8/2003 | Nakagawa et al. |
| 2004/0020224 A1 | 2/2004 | Bash et al. |
| 2004/0065097 A1 | 4/2004 | Bash et al. |
| 2004/0065104 A1 | 4/2004 | Bash et al. |
| 2004/0075984 A1 | 4/2004 | Bash et al. |
| 2004/0089009 A1 | 5/2004 | Bash et al. |
| 2004/0089011 A1 | 5/2004 | Patel et al. |
| 2004/0262409 A1 | 12/2004 | Crippen et al. |
| 2005/0023363 A1 | 2/2005 | Sharma et al. |
| 2005/0267639 A1 | 12/2005 | Sharma et al. |
| 2007/0038414 A1 | 2/2007 | Rasmussen et al. |
| 2007/0078635 A1 | 4/2007 | Rasmussen et al. |
| 2007/0150215 A1 | 6/2007 | Spitaels et al. |
| 2007/0174024 A1 | 7/2007 | Rasmussen et al. |
| 2008/0105412 A1 | 5/2008 | Carlsen et al. |

(Continued)

OTHER PUBLICATIONS

"Essential Cooling System Requirements for Next Generation Data Centers," White Paper #5, Revision 3, 2003 American Power Conversion, Rev 2002-3, pp. 1-10.

(Continued)

*Primary Examiner* — Hugh Jones

(74) *Attorney, Agent, or Firm* — Lando & Anastasi, LLP

(57) ABSTRACT

A system and method for designing aspects of a cooling system for a data center is provided. A method is provided including computing cooling redundancy at each rack position in a data center, in real time. The redundancy can be reported using the traditional N+1, N+2, etc. notation, where N is the number of coolers required to meet the primary cooling load type specification. The method substantially reduces the computational complexity of computing cooling redundancy.

18 Claims, 8 Drawing Sheets

(56) References Cited

U.S. PATENT DOCUMENTS

| | | | |
|---|---|---|---|
| 2008/0174954 A1* | 7/2008 | VanGilder et al. | 361/687 |
| 2008/0198549 A1 | 8/2008 | Rasmussen et al. | |
| 2009/0138313 A1 | 5/2009 | Morgan et al. | |
| 2009/0223234 A1 | 9/2009 | Campbell et al. | |
| 2009/0259343 A1 | 10/2009 | Rasmussen et al. | |
| 2009/0326879 A1 | 12/2009 | Hamann et al. | |
| 2010/0256959 A1 | 10/2010 | VanGilder et al. | |
| 2010/0286956 A1 | 11/2010 | VanGilder et al. | |

OTHER PUBLICATIONS

"How and Why Mission-Critical Cooling Systems Differ From Common Air Conditions," White Paper #56, Revision 2, 2003 American Power Conversion, Rev 2003-2, pp. 1-13.

Abdlmonem H. Beitelmal et al.: "Thermo-Fluids Provisioning of a High Performance High Density Data Center" Distributed and Parallel Databases, Kluwer Academic Publishers, BO, vol. 21, No. 2-3, Apr. 22, 2006, pp. 227-238, XP019499843, ISSN: 1573-7578.

APC User's Guide Brochure, "InfraStruXure Manager," Mar. 2004, 181 pgs.

Bash, C. E. et al.: "Balance of Power: Dynamic Thermal Management for Internet Data Centers", IEEE Internet Computing , Jan. 1, 2005, pp. 42-49, vol. 9, No. 1, IEEE Service Center, New York, NY.

Herrlin, M.K., "Rack Cooling Effectiveness in Data Centers and Telecom Central Offices: The Rack Cooling Index (RCI)," ASHRAE Transaction, 2005, pp. 725-731, vol. 111(2).

N. Rasmussen, "Calculating Total Cooling Requirements for Data Centers", White Paper #25, pp. 1-8, American Power Conversion, May 20, 2004, published on World Wide Web.

N. Rasmussen, "Cooling Strategies for Ultra-High Density Racks and Blade Servers", White Paper #46, pp. 1-22, American Power Conversion, Mar. 29, 2005, published on World Wide Web.

N. Rasmussen, "Strategies for Deploying Blade Servers in Existing Data Centers", White Paper #125, pp. 1-14, American Power Conversion, Mar. 29, 2005, published on World Wide Web.

Notification of Transmittal of the International Search Report and the Written Opinion of the International Searching Authority, o the Declaration for International Applicataion No. PCT/US2011/066089 mailed Mar. 19, 2012, 28 pages.

Vangilder et al., "Airflow Uniformity thourhg Perforated Tiles in a Raised-Floor Data Center", White Paper 121, Jul. 17-22, 2005, 10 pages.

Vangilder, James, W., et al., "Capture index: an airflow-based rack cooling performance metric," 2007, ASHRAE Transactions, vol. 113, pp. 126-136.

Vangilder, James, W., et al., "Real-time prediction of rack-cooling performance," 2006, ASHRAE Transactions, vol. 112, pp. 151-162.

Chen, Q.and Srebric, J., "Simplified Diffuser Boundary Conditions for Numerical Room Airflow Models," Final Report for ASHRAE RP-1009, Department of Architecture, Massachusetts Institute of Technology, Cambridge, MA, 2000, 181 pages.

* cited by examiner

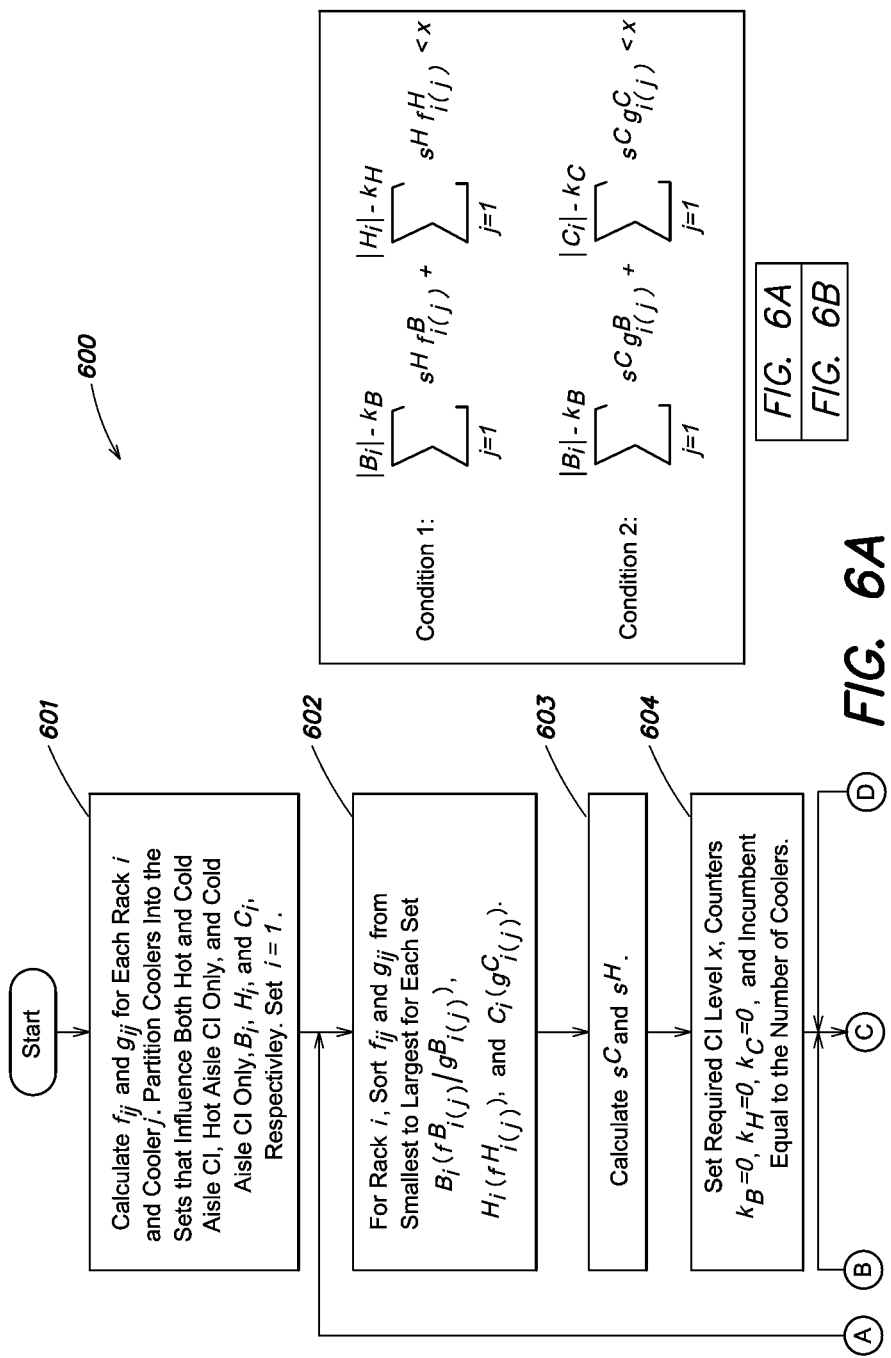

| $f_{ij}$ | | Cooler | | | | Hot Aisle Red. |
|---|---|---|---|---|---|---|
| | 1 | 2 | 3 | 4 | S | |
| Rack 1 | 0.29 | 0.29 | 0.23 | 0.19 | 2.93 | N+2 |
| 2 | 0.15 | 0.32 | 0.41 | 0.12 | 1.54 | N+1 |
| 3 | 0.14 | 0.30 | 0.38 | 0.12 | 1.00 | N |
| 4 | 0.28 | 0.17 | 0.13 | 0.43 | 2.24 | N+1 |
| 5 | 0.12 | 0.25 | 0.25 | 0.39 | 1.87 | N+1 |
| 6 | 0.11 | 0.23 | 0.30 | 0.36 | 1.05 | N |
| 7 | 0.07 | 0.15 | 0.19 | 0.23 | 1.00 | Not Covered |

| $g_{ij}$ | | Cooler | | | | Cold Aisle Red. |
|---|---|---|---|---|---|---|
| | 1 | 2 | 3 | 4 | S | |
| Rack 1 | 0.34 | 0.34 | 0.33 | -- | 3.38 | N+2 |
| 2 | 0.30. | 0.34 | 0.36 | -- | 3.05 | N+1 |
| 3 | 0.30 | 0.34 | 0.36 | -- | 2.76 | N+1 |
| 4 | -- | -- | -- | 0.92 | 1.00 | N |
| 5 | -- | -- | -- | 0.89 | 1.00 | Not Covered |
| 6 | -- | -- | -- | 0.80 | 1.00 | Not Covered |
| 7 | -- | -- | -- | 0.73 | 1.00 | Not Covered |

FIG. 8

US 8,949,081 B2

METHOD FOR COMPUTING COOLING REDUNDANCY AT THE RACK LEVEL

RELATED APPLICATIONS

The present application is related to pending U.S. patent application Ser. No. 12/416,567, filed Apr. 1, 2009, entitled METHOD FOR COMPUTING COOLING REDUNDANCY AT THE RACK LEVEL, and incorporated herein in its entirety by reference.

BACKGROUND OF INVENTION

1. Field of the Invention

At least one embodiment in accord with the present invention relates generally to systems and methods for data center management, and more specifically, to systems and methods for managing data center cooling, especially for computing redundancy in an efficient manner 2. Discussion of Related Art In response to the increasing demands of information-based economies, information technology networks continue to proliferate across the globe. One manifestation of this growth is the centralized network data center. A centralized network data center typically consists of various information technology equipment, collocated in a structure that provides network connectivity, electrical power and cooling capacity. Often the equipment is housed in specialized enclosures termed "racks" which integrate these connectivity, power and cooling elements. In some data center configurations, these racks are organized into rows and clusters having hot and cold aisles to decrease the cost associated with cooling the information technology equipment. These characteristics make data centers a cost effective way to deliver the computing power required by many software applications.

Various processes and software applications, such as the InfraStruxure® family of products available from American Power Conversion by Schneider Electric (APC) of West Kingston, R.I., have been developed to aid data center personnel in designing and maintaining efficient and effective of data centers configurations. These tools often guide data center personnel through activities such as designing the data center structure, positioning equipment within the data center prior to installation and adding, repositioning, or removing equipment after construction and installation are complete. Thus, conventional tool sets provide data center personnel with a standardized and predictable design methodology.

The computational complexity of computing cooling redundancy using conventional methods can be as high as $2^n$. Although conventional methods can be made less computationally complex by conditionally computing cooling redundancy under a restricted set of boundary conditions, conventional methods nevertheless have an inherent computational complexity of $2^n$.

SUMMARY OF THE INVENTION

Aspects of embodiments of the invention provide methods for computing cooling redundancy at each rack position in a data center, in real time. The redundancy can be reported using the traditional N+1, N+2, etc. notation, where N is the number of coolers required to meet the primary cooling load type specification. The redundancy can be reported in terms of a Cooling Reliability Index (CRI) which also takes into account the inherent availability of the specific cooling units in the design.

According to aspects of one embodiment, a computer-implemented method of determining cooling redundancy information, includes: modeling in a computer a location having plural racks of equipment to be cooled by a plurality of coolers; for each rack, computing a fraction of a rack's airflow handled by a cooler; for each rack: sorting over the plurality of coolers the fraction of a rack's airflow handled by each cooler; summing the computed fractions of the rack's airflow captured by the cooler from smallest to largest until the cooling index for the rack is adequate, while keeping a count of coolers whose computed fractions are not included in the sum; and reporting the redundancy as a value determined by the count of coolers whose contributions are not included in the sum. In a variation, aspects of the embodiment include computing a surplus cooling factor; and multiplying the computed fractions by the surplus cooling factor prior to summing. In a further variation, computing the fraction further comprises: computing the fraction of a rack's hot airflow output captured by a cooler. In another, further variation, computing the fraction further comprises: computing the fraction of a rack's cold airflow input provided by a cooler. In yet another, further variation, computing the fraction further comprises: computing the fraction of a rack's cold airflow input provided by a cooler on a cold aisle adjacent the rack; and computing the fraction of a rack's hot airflow output captured by a cooler on a hot aisle adjacent the rack; and further comprising: performing the sorting and summing separately for the computed fractions of a rack's cold airflow input provided by a cooler on a cold aisle and the computed fractions of a rack's hot airflow output captured by a cooler on a hot aisle; and further wherein the value determined by the count of coolers whose contributions are not included in the sums is a linear combination of the sums. In even yet another, further variation, computing the fraction further comprises: computing the fraction of a rack's cold airflow input provided by a cooler on a cold aisle adjacent the rack; and computing the fraction of a rack's hot airflow output captured by a cooler on a hot aisle adjacent the rack; and further comprising: performing the sorting and summing separately for the computed fractions of a rack's cold airflow input provided by a cooler on a cold aisle and the computed fractions of a rack's hot airflow output captured by a cooler on a hot aisle; and further wherein the value determined by the count of coolers whose contributions are not included in the sums is a maximum of one of the sums. In an additional, further variation, computing the fraction further comprises: computing the fraction of a rack's cold airflow input provided by a cooler on a cold aisle adjacent the rack; and computing the fraction of a rack's hot airflow output captured by a cooler on a hot aisle adjacent the rack; and further comprising: performing the sorting and summing separately for the computed fractions of a rack's cold airflow input provided by a cooler on a cold aisle and the computed fractions of a rack's hot airflow output captured by a cooler on a hot aisle; and further wherein the value determined by the count of coolers whose contributions are not included in the sums is a minimum of one of the sums.

According to aspects of another embodiment, a computer-implemented apparatus for determining cooling redundancy information, includes: a computer storage system in which is held a numerical computer model of representing a location having plural racks of equipment to be cooled by a plurality of coolers; and a computer processor executing a sequence of instructions directing: for each rack represented in the model, computing a fraction of a rack's airflow handled by a cooler represented in the model; for each rack represented in the model: sorting over the plurality of coolers represented in the model the fraction of a rack's airflow handled by each cooler;

summing the computed fractions of the rack's airflow captured by the cooler from smallest to largest until the cooling index for the rack is adequate, while keeping a count of coolers whose computed fractions are not included in the sum; and reporting the redundancy as a value determined by the count of coolers whose contributions are not included in the sum. According to a variation, the embodiment further comprises the computer processor executing a sequence of instructions directing: computing a surplus cooling factor; and multiplying the computed fractions by the surplus cooling factor prior to summing. In a further variation, computing the fraction further comprises: computing the fraction of a rack's hot airflow output captured by a cooler. In another, further variation, computing the fraction further comprises: computing the fraction of a rack's cold airflow input provided by a cooler. In yet another, further variation, computing the fraction further comprises: computing the fraction of a rack's cold airflow input provided by a cooler on a cold aisle adjacent the rack; and computing the fraction of a rack's hot airflow output captured by a cooler on a hot aisle adjacent the rack; and further comprising the computer processor executing a sequence of instructions directing: performing the sorting and summing separately for the computed fractions of a rack's cold airflow input provided by a cooler on a cold aisle and the computed fractions of a rack's hot airflow output captured by a cooler on a hot aisle; and further wherein the value determined by the count of coolers whose contributions are not included in the sums is a linear combination of the sums. In even yet another, further variation, computing the fraction further comprises: computing the fraction of a rack's cold airflow input provided by a cooler on a cold aisle adjacent the rack; and computing the fraction of a rack's hot airflow output captured by a cooler on a hot aisle adjacent the rack; and further comprising the computer processor executing a sequence of instructions directing: performing the sorting and summing separately for the computed fractions of a rack's cold airflow input provided by a cooler on a cold aisle and the computed fractions of a rack's hot airflow output captured by a cooler on a hot aisle; and further wherein the value determined by the count of coolers whose contributions are not included in the sums is a maximum of one of the sums. In an additional, further variation, computing the fraction further comprises: computing the fraction of a rack's cold airflow input provided by a cooler on a cold aisle adjacent the rack; and computing the fraction of a rack's hot airflow output captured by a cooler on a hot aisle adjacent the rack; and further comprising the computer processor executing a sequence of instructions directing: performing the sorting and summing separately for the computed fractions of a rack's cold airflow input provided by a cooler on a cold aisle and the computed fractions of a rack's hot airflow output captured by a cooler on a hot aisle; and further wherein the value determined by the count of coolers whose contributions are not included in the sums is a minimum of one of the sums.

According to aspects of yet another embodiment, a computer readable medium having stored thereon sequences of instruction includes instructions that will cause a processor to: model in a computer a location having plural racks of equipment to be cooled by a plurality of coolers; for each rack, compute a fraction of a rack's airflow handled by a cooler; for each rack: sort over the plurality of coolers the fraction of a rack's airflow handled by each cooler; sum the computed fractions of the rack's airflow captured by the cooler from smallest to largest until the cooling index for the rack is adequate, while keeping a count of coolers whose computed fractions are not included in the sum; and report the redundancy as a value determined by the count of coolers whose contributions are not included in the sum. In a variation, the computer readable medium further includes instructions that will cause a processor to: compute a surplus cooling factor; and multiply the computed fractions by the surplus cooling factor prior to summing. In a further variation, computing the fraction further comprises: computing the fraction of a rack's hot airflow output captured by a cooler. In another, further variation, computing the fraction further comprises: computing the fraction of a rack's cold airflow input provided by a cooler. In yet another, further variation, computing the fraction further comprises: computing the fraction of a rack's cold airflow input provided by a cooler on a cold aisle adjacent the rack; and computing the fraction of a rack's hot airflow output captured by a cooler on a hot aisle adjacent the rack; and further comprising: performing the sorting and summing separately for the computed fractions of a rack's cold airflow input provided by a cooler on a cold aisle and the computed fractions of a rack's hot airflow output captured by a cooler on a hot aisle; and further wherein the value determined by the count of coolers whose contributions are not included in the sums is a linear combination of the sums. In even yet another, further variation, computing the fraction further comprises: computing the fraction of a rack's cold airflow input provided by a cooler on a cold aisle adjacent the rack; and computing the fraction of a rack's hot airflow output captured by a cooler on a hot aisle adjacent the rack; and further comprising: performing the sorting and summing separately for the computed fractions of a rack's cold airflow input provided by a cooler on a cold aisle and the computed fractions of a rack's hot airflow output captured by a cooler on a hot aisle; and further wherein the value determined by the count of coolers whose contributions are not included in the sums is a maximum of one of the sums. In an additional, further variation, computing the fraction further comprises: computing the fraction of a rack's cold airflow input provided by a cooler on a cold aisle adjacent the rack; and computing the fraction of a rack's hot airflow output captured by a cooler on a hot aisle adjacent the rack; and further comprising: performing the sorting and summing separately for the computed fractions of a rack's cold airflow input provided by a cooler on a cold aisle and the computed fractions of a rack's hot airflow output captured by a cooler on a hot aisle; and further wherein the value determined by the count of coolers whose contributions are not included in the sums is a minimum of one of the sums.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 6A and 6B show a fourth aspect of an example process for designing a data center configuration according to an embodiment;

FIG. 8 is a Table showing the result of performing the process of FIG. 3 on the layout of FIG. 7.

DETAILED DESCRIPTION

Figure 1:
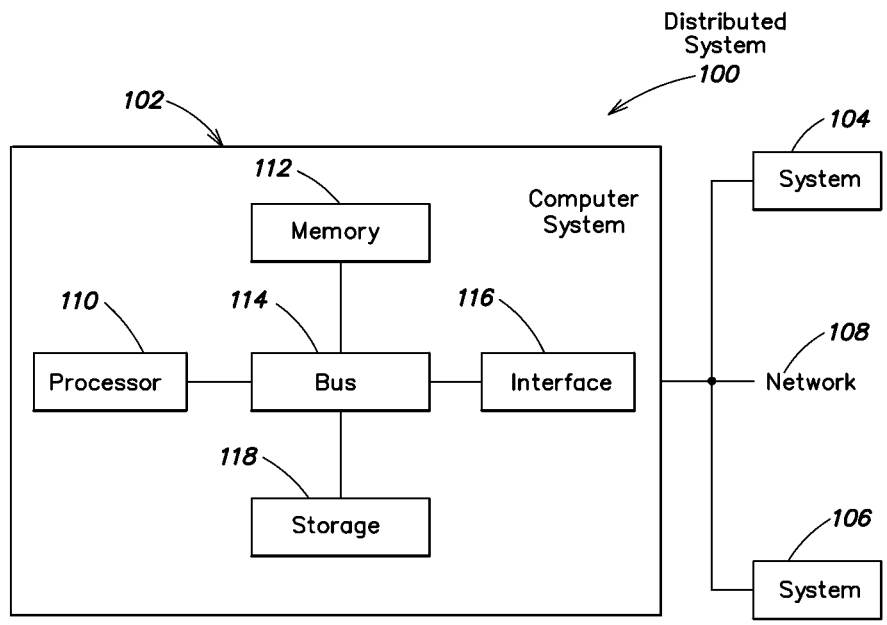
FIG. 1 shows an example computer system with which various aspects in accord with the present invention may be implemented.

At least some embodiments in accord with the present invention relate to systems and processes through which a user may design data center configurations. These systems may facilitate this design activity by allowing the user to assess data center cooling redundancy at various levels of granularity, including cluster, row and rack levels.

Design tools such as Computational Fluid Dynamics (CFD) and real-time cooling calculators incorporated in conventional tools offered by APC facilitate the proper matching of rack-by-rack IT load with primary cooling requirements. The tool disclosed in U.S. patent application Ser. No. 12/416,567, referred to above, automates the process of determining the cooling available to each rack under various cooling failure scenarios. The data center designer or operator benefits from a design tool incorporating aspects of embodiments of the present invention, which improves the efficiency with which such automated process is carried out.

Consider a cluster of racks and row-based coolers in which several coolers are located near the left end of the cluster and another, single cooler is located near the right end of the cluster. The failure of a single cooler at the left end will likely have no effect on cooling performance for racks near the left end as multiple coolers in the area will continue to function; however, a failure of the single cooler at the right end will likely result in insufficient cooling for racks near the right end of the cluster as there are no other coolers in the area to cover the load.

In some embodiments, models may include structural components of a data center, such as, among other structural components, walls, ceilings, floors and the spaces defined by these structural components. The model may also include representations of data center equipment, such as, among other equipment, cooling consumers and cooling providers, located within the model space. Cooling providers may be any element of the data center that is involved in the generation or distribution of cool air to other data center equipment. Examples of cooling providers include, among others, computer room air conditioners (CRACs), computer room air handlers (CRAHs) and tiles located in the floor or ceiling. Cooling consumers include any element of the data center that consumes the cooling supply generated by the cooling providers. Examples of cooling consumers include, among others, network devices, servers and other information technology equipment. In a data center, these cooling consumers may be mounted in racks, although this is not a requirement. In at least one embodiment, the model may calculate and display cooling performance information, such as cooling metrics, through representations of data center equipment. Further, in at least one embodiment, the model may calculate and display redundancy information, such as a number of cooling equipment failures tolerated at each rack or a Cooling Reliability Index (CRI).

The aspects disclosed herein, which are in accord with the present invention, are not limited in their application to the details of construction and the arrangement of components set forth in the following description or illustrated in the drawings. These aspects are capable of assuming other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

For example, according to one embodiment of the present invention, a computer system is configured to perform any of the functions described herein, including but not limited to, configuring, modeling and presenting information regarding specific data center configurations. However, such a system may also perform other functions, such as suggesting changes to data center configurations, based on, for example, industry best practices. Moreover, the systems described herein may be configured to include or exclude any of the functions discussed herein. Thus the invention is not limited to a specific function or set of functions. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Computer System

General Description

Various aspects and functions described herein in accord with the present invention may be implemented as hardware or software on one or more computer systems. There are many examples of computer systems currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects in accord with the present invention may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Thus, the invention is not limited to executing on any particular system or group of systems. Further, aspects may be implemented in software, hardware or firmware, or any combination thereof. Thus, aspects in accord with the present invention may be implemented within methods, acts, systems, system elements and components using a variety of hardware and software configurations; the invention is not limited to any particular distributed architecture, network, or communication protocol.

FIG. 1 shows a block diagram of a distributed computer system 100, in which various aspects and functions in accord with the present invention may be practiced. Distributed computer system 100 may include one more computer systems. For example, as illustrated, distributed computer system 100 includes computer systems 102, 104 and 106. As shown, computer systems 102, 104 and 106 are interconnected by, and may exchange data through, communication network 108. Network 108 may include any communication network through which computer systems may exchange data. To exchange data using network 108, computer systems 102, 104 and 106 and network 108 may use various methods, protocols and standards, including, among others, token ring, ethernet, wireless ethernet, Bluetooth, TCP/IP, UDP, Http, FTP, SNMP, SMS, MMS, SS7, Json, Soap, and Corba. To ensure data transfer is secure, computer systems 102, 104 and 106 may transmit data via network 108 using a variety of security measures including TSL, SSL or VPN among other security techniques. While distributed computer system 100 illustrates three networked computer systems, distributed computer system 100 may include any number of computer systems and computing devices, networked using any medium and communication protocol.

Various aspects and functions in accord with the present invention may be implemented as specialized hardware or software executing in one or more computer systems including computer system 102 shown in FIG. 1. As depicted, computer system 102 includes processor 110, memory 112, bus 114, interface 116 and storage 118. Processor 110 may perform a series of instructions that result in manipulated data. Processor 110 may be a commercially available processor such as an Intel Pentium, Intel Core, Intel Xeon, Motorola PowerPC, SGI MIPS, Sun UltraSPARC, or Hewlett-Packard PA-RISC processor, but may be any type of processor or controller as many other processors and controllers are available. Processor 110 is connected to other system elements, including one or more memory devices 112, by bus 114.

Memory 112 may be used for storing programs and data during operation of computer system 102. Thus, memory 112 may be a relatively high performance, volatile, random access memory such as a dynamic random access memory (DRAM) or static memory (SRAM). However, memory 112 may include any device for storing data, such as a disk drive or other non-volatile storage device. Various embodiments in accord with the present invention may organize memory 112 into particularized and, in some cases, unique structures to perform the aspects and functions disclosed herein.

Components of computer system 102 may be coupled by an interconnection element such as bus 114. Bus 114 may include one or more physical busses, for example, busses between components that are integrated within a same machine, but may include any communication coupling between system elements including specialized or standard computing bus technologies such as IDE, SCSI, PCI, Infini-Band, and others. Thus, bus 114 enables communications, for example, data and instructions, to be exchanged between system components of computer system 102.

Computer system 102 also includes one or more interface devices 116 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow computer system 102 to exchange information and communicate with external entities, such as users and other systems.

Storage system 118 may include a computer readable and writeable nonvolatile storage medium in which instructions are stored that define a program to be executed by the processor. Storage system 118 also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. The medium may, for example, be optical disk, magnetic disk or flash memory, among others. In operation, the processor or some other controller may cause data to be read from the nonvolatile recording medium into another memory, such as memory 112, that allows for faster access to the information by the processor than does the storage medium included in storage system 118. The memory may be located in storage system 118 or in memory 112, however, processor 110 may manipulate the data within the memory 112, and then copies the data to the medium associated with storage system 118 after processing is completed. A variety of components may manage data movement between the medium and integrated circuit memory element and the invention is not limited thereto. Further, the invention is not limited to a particular memory system or storage system.

Although computer system 102 is shown by way of example as one type of computer system upon which various aspects and functions in accord with the present invention may be practiced, aspects of the invention are not limited to being implemented on the computer system as shown in FIG. 1. Various aspects and functions in accord with the present invention may be practiced on one or more computers having a different architectures or components than that shown in FIG. 1. For instance, computer system 102 may include specially-programmed, special-purpose hardware, such as for example, an application-specific integrated circuit (ASIC) tailored to perform a particular operation disclosed herein. While another embodiment may perform the same function using several general-purpose computing devices running MAC OS System X on Motorola PowerPC processors, Intel Core processors, or Intel Xeon processors, and several specialized computing devices running proprietary hardware and operating systems.

Computer system 102 may be a computer system including an operating system that manages at least a portion of the hardware elements included in computer system 102. Usually, a processor or controller, such as processor 110, executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., and Debian-derived GNU/Linux distributions such as Ubuntu, a Solaris operating system available from Sun Microsystems, or a UNIX operating systems available from various sources. Many other operating systems may be used, and embodiments are not limited to any particular implementation.

The processor and operating system together define a computer platform for which application programs in high-level programming languages may be written. These component applications may be executable, intermediate, for example, C-, bytecode or interpreted code which communicates over a communication network, for example, the Internet, using a communication protocol, for example, TCP/IP. Similarly, aspects in accord with the present invention may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accord with the present invention may be implemented in a non-programmed environment, for example, documents created in HTML, XML or other format that, when viewed in a window of a browser program, render aspects of a graphical-user interface or perform other functions. Further, various embodiments in accord with the present invention may be implemented as programmed or non-programmed elements, or any combination thereof. For example, a web page may be implemented using HTML while a data object called from within the web page may be written in C++. Thus, the invention is not limited to a specific programming language and any suitable programming language could also be used.

A computer system included within an embodiment may perform functions outside the scope of the invention. For instance, aspects of the system may be implemented using an existing commercial product, such as, for example, Database Management Systems such as SQL Server available from Microsoft of Seattle Wash., Oracle Database from Oracle of Redwood Shores, Calif., and MySQL from MySQL AB of Uppsala, Sweden or integration software such as Web Sphere middleware from IBM of Armonk, N.Y. However, a computer system running, for example, SQL Server may be able to support both aspects in accord with the present invention and databases for sundry applications not within the scope of the invention.

Example System Architecture

Figure 2:
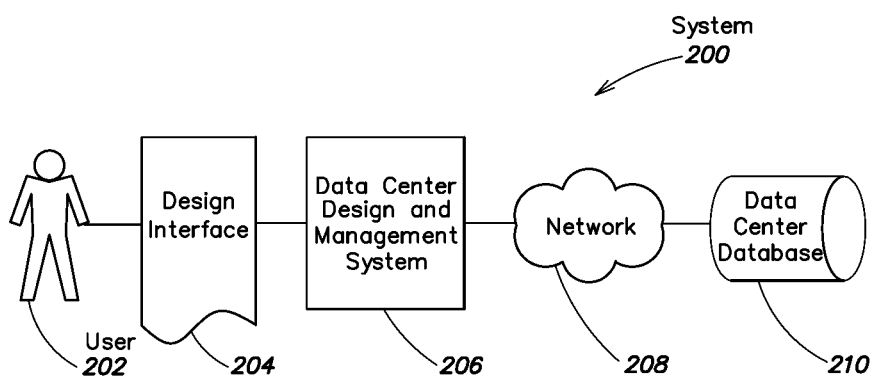
FIG. 2 illustrates an example distributed system including an embodiment.

FIG. 2 presents a context diagram including physical and logical elements of distributed system 200. As shown, distributed system 200 is specially configured in accord of the present invention. The system structure and content recited with regard to FIG. 2 is for exemplary purposes only and is not intended to limit the invention to the specific structure shown in FIG. 2. As will be apparent to one of ordinary skill in the art, many variant system structures can be architected without deviating from the scope of the present invention. The particular arrangement presented in FIG. 2 was chosen to promote clarity.

Information may flow between the elements, components and subsystems depicted in FIG. 2 using any technique. Such techniques include, for example, passing the information over the network via TCP/IP, passing the information between modules in memory and passing the information by writing to a file, database, or some other non-volatile storage device. Other techniques and protocols may be used without departing from the scope of the invention.

Referring to FIG. 2, system 200 which interacts with user 202, includes design interface 204, data center design and management system 206, communications network 208 and data center database 210. System 200 may allow user 202, such as a data center architect or other data center personnel, to interact with design interface 204 to create or modify a model of one or more data center configurations. According to one embodiment, design interface 204 may include aspects of the floor editor and the rack editor as disclosed in Patent Cooperation Treaty Application No. PCT/US08/63675, entitled METHODS AND SYSTEMS FOR MANAGING FACILITY POWER AND COOLING, filed on May 15, 2008, which is incorporated herein by reference in its entirety and is hereinafter referred to as PCT/US08/63675. In other embodiments, design interface 204 may be implemented with specialized facilities that enable user 202 to design, in a drag and drop fashion, a model that includes a representation of the physical layout of a data center or any subset thereof. This layout may include representations of data center structural components as well as data center equipment. The features of design interface 204, as may be found in various embodiments in accord with the present invention, are discussed further below.

As shown in FIG. 2, data center design and management system 206 presents data design interface 204 to user 202. According to one embodiment, data center design and management system 206 may include the data center design and management system as disclosed in PCT/US08/63675. In this embodiment, design interface 204 may incorporate functionality of the input module, the display module and the builder module included in PCT/US08/63675 and may use the database module to store and retrieve data.

As illustrated, data center design and management system 206 may exchange information with data center database 210 via network 208. This information may include any information required to support the features and functions of data center design and management system 206. For example, in one embodiment, data center database 210 may include at least some portion of the data stored in the data center equipment database described in PCT/US08/63675. In another embodiment, this information may include any information required to support design interface 204, such as, among other data, the physical layout of one or more data center model configurations, the production and distribution characteristics of the cooling providers included in the model configurations, the consumption characteristics of the cooling consumers in the model configurations and one or more cooling metrics characterizing the amount of cool air produced by the cooling providers that is lost prior to being consumed by the cooling consumers.

In at least one embodiment, data center database 210 may store, as part of the physical layout of a data center model configuration, the location and characteristics of the tiles that make up surfaces of the data center, such as the floor, ceiling and walls, of a model space. In at least one embodiment, the tiles may be floor tiles that are part of a raised floor, while in another embodiment the tiles may be ceiling tiles that are part of a drop ceiling. The characteristics of the tiles stored in data center database 210 may include, among other characteristics, whether or not the tiles are perforated, the size of the tiles and cooling metrics associated with the tiles, such as, in the example of a perforated tile, the airflow rate and temperature of air passing through it. As used herein, the term "perforated tile" may include any surface designed to allow airflow to pass through its boundary. Examples of perforated tiles include, among others standard-sized perforated tiles, custom-sized perforated tiles, cover grills and open holes. In some embodiments, this information is useful for providing enhanced functionality through design interface 204.

In another embodiment, data center database 210 may store, as a portion of the production and distribution characteristics of the cooling providers, the type of cooling provider, the amount of cool air provided by the cooling provider, and a temperature of cool air provided by the cooling provider. Thus, for example, data center database 210 includes record of a particular type of CRAC unit that is rated to deliver airflow at the rate of 5,600 cfm at a temperature of 68 degrees Fahrenheit. In addition, the data center database 210 may store one or more cooling metrics, such as an airflow leakage rate of an air plenum, such as a raised floor or a drop ceiling.

Data center database 210 may take the form of any logical construction capable of storing information on a computer readable medium including, among other structures, flat files, indexed files, hierarchical databases, relational databases or object oriented databases. The data may be modeled using unique and foreign key relationships and indexes. The unique and foreign key relationships and indexes may be established between the various fields and tables to ensure both data integrity and data interchange performance.

The computer systems shown in FIG. 2, which include data center design and management system 206, network 208 and data center equipment database 210, each may include one or more computer systems. As discussed above with regard to FIG. 1, computer systems may have one or more processors or controllers, memory and interface devices. The particular configuration of system 200 depicted in FIG. 2 is used for illustration purposes only and embodiments of the invention may be practiced in other contexts. Thus, the invention is not limited to a specific number of users or systems.

Design Interface Embodiments

According to various embodiments, design interface 204 may provide users with a high degree of flexibility regarding how and when they design data center cooling systems. In these embodiments, the user may design the entire cooling system in advance of the remainder of the data center configuration, may design the cooling system concurrently with other attributes of the data center or may design the cooling system after other parts of the data center design are complete. Thus, design interface 204 may be used to design new data centers or may be used to modify the designs of existing data centers. The formulation of useful systems and methods for conducting these design activities is impacted by the unique manner in which design interface 204 may be structured and organized. Conversely, the elements used and acts performed in these design activities impact the attributes and facilities of this embodiment of design interface 204.

Figure 3:
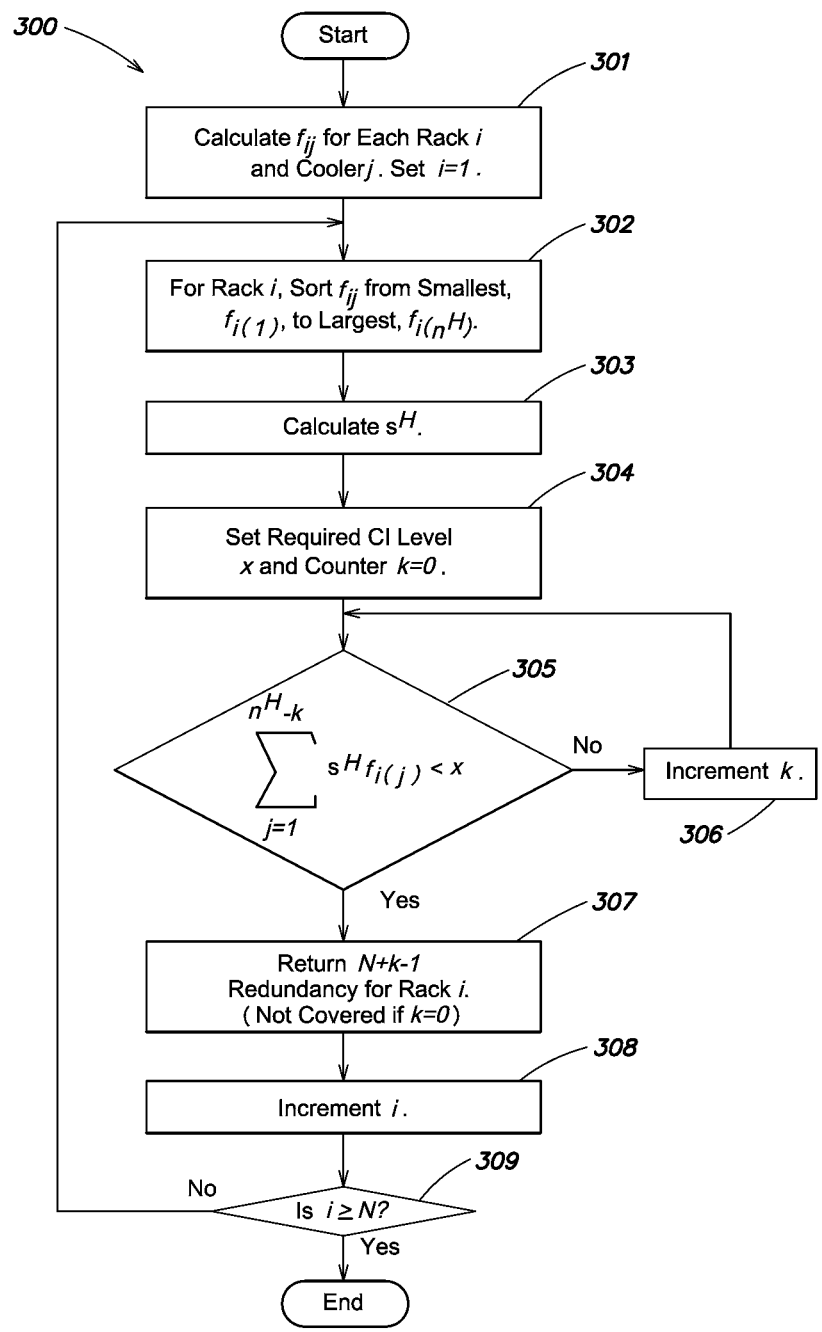
FIG. 3 illustrates a first aspect of an example process for designing a data center configuration according to an embodiment.

Design interface 204 may provide functionality through a variety of user interface screens and elements. FIG. 3 illustrates an example of a user interface 300 that may be included in design interface 204 according to some embodiments. As shown, user interface 300 includes many of the user interface elements discussed in PCT/US08/63675 with regard to the floor editor and the rack editor. These elements may function within this embodiment as they function with the floor editor and the rack editor disclosed within PCT/US08/63675.

In the context of this design interface, an embodiment provides features for computing and ensuring cooling redundancy at specific rack locations. Conventionally, there is no concept of cooling redundancy at a specific rack location. A single redundancy level is conventionally stated for an entire facility. In some cases, some racks in a facility will have sufficient redundancy while others will not. Other facilities may be so over-designed to ensure cooling redundancy at all locations that substantial capital and ongoing energy costs are wasted. The exemplary embodiment provides a method by which redundancy can be computed for each rack location in a new or existing facility. With this information, data center designers and operators can make fact-based business decisions related to IT uptime and expenditures. For example, the designer of a new facility can minimize the number of coolers to just satisfy the level of redundancy required—which may be potentially different in different areas of the data center—thereby avoiding costs associated with over-provisioning. As another example, a data center operator may use the method to determine where to install a new server so that the cooling redundancy requirements of the new server will be met and that the cooling redundancy of other nearby IT equipment will not be adversely affected by the installation.

In accordance with further aspects and embodiments, a Cooling Reliability Index (CRI) can be computed in addition to or in lieu of the traditional N+1-style redundancy specification. The CRI takes into account the inherent reliability characteristics (e.g. MTBF, MTTR) of the cooling equipment and can be used to estimate the actual fraction of time that adequate cooling is available at each rack location.

Computing N+1 Redundancy at Rack Level

Redundancy calculations for clusters of racks and coolers, based on N+1-style calculations, can be implemented within any suitable data center design tool. The illustrative embodiment employs a value called the Capture Index (CI), an index described in detail in pending U.S. patent application Ser. No. 11/342,300, filed Jan. 27, 2006, published as document 2007-0038414 A1 on Feb. 15, 2007, incorporated herein by reference. In summary, the CI represents either the percentage of exhaust air from a location of concern within a data center that is "captured" by a cooler for that location (for a hot-aisle location where air is exhausted from the locations into the aisle) or the percentage of cooled air that a location of concern "captures" directly from a cooler within the data center (for cold-aisle locations where air is received at the locations from the aisle). For the purpose of this exemplary embodiment, the CI serves as the cooling performance metric although other metrics, like rack inlet temperature, can be used.

Aspects of the exemplary method estimate redundancy levels with only one cooling calculation, rather than $2^n$ calculations. This improvement is due to two factors: 1) the recognition that the airflow contributions due to a given cooling unit are largely independent of other cooling units in the room; and, 2) the use of a surplus cooling airflow coefficient, which permits simulation of the airflow which cooling units can supply or collect when one or more of the units are turned off. Since cooling performance may be expressed in terms of cold aisle CI, hot aisle CI, or as a combination of the two CI's, redundancy can be estimated using one of a variety of functions of CI selected by the operator based on experience and various room design factors.

In this discussion, a cooler-failure may be a failure of a cooler or any other cooling related equipment that reduces the effective cooling of a location by a specified quantity. Making a determination of rack cooling performance at the room level requires considering the effect of cooler failures anywhere in the room on the rack in question. Methods and apparatus embodying aspects of the invention simply test all cooler-failure scenarios for the room and keep track of the limiting number and type failures during which adequate cooling at a rack is nevertheless maintained. For example, if cooling performance of a rack remains adequate (adequate cooling performance being a CI above some minimum threshold) with any two coolers in the room "failed", the rack has "N+2" redundancy at the room level.

The CI only identifies situations where inadequate cooling at a rack arises due to airflow inadequacies. An additional constraint on adequate cooling performance that can be optionally applied is that all remaining functional coolers must have a cooling capacity capable of cooling the total heat load of the room during a failure scenario; if not, such a failure might be interpreted as a cooling failure at all rack locations. A similar additional, optional constraint is that the remaining functional coolers must have a cooling capacity capable of preventing localized hot spots resulting in a rack cooling failure due to effects other than inadequate air flow. These optional constraints can be applied in addition to the CI analysis, or can be, in some cases, built into the CI analysis by incorporating both the CI and temperature information into a more evolved index, or can be applied in any other suitable way. These additional constraints, however, represent unlikely failure modes under current design practices.

Embodiments according to aspects of the invention provide an estimate of the cooling redundancy to an end user. Correct placement of cooling units may be difficult to guess due to the large deviations in local and room airflows that even slight adjustments can cause. Therefore, the exemplary tool will estimate a racks cooling redundancy. The estimated redundancy is a measure of the 'extra' cooling available. This additional cooling will perhaps permit one or more coolers to shut down or fail at a time and maintain full server operations. Thus, the redundancy may be defined differently depending on the metric used as defined in terms of the largest number of coolers that can be shut down, in any combination, while still operating equipment racks safely.

Cooling redundancy may be defined differently depending on scope. The higher levels of room and cluster redundancy can paint a general picture, while the rack-by-rack measure can pinpoint areas for improvement.

This general method can be used to predict redundancy levels with any computational airflow estimation method that supplies users with the percentage of rack i's exhaust captured by cooling resource j, $f_{ij}$, and the percentage of rack i's inlet airflow supplied directly by cooling resource j, $g_{ij}$.

Hot aisle CI (HACI) for a rack is just a sum of the $f_{ij}$ over all coolers, j. Cooler airflow paths for operating coolers remain similar to those observed with all coolers operational, even when observed in the presence of turned-off coolers. Deactivation of the most important cooler is simulated by just subtracting its $f_{ij}$ from the original CI estimate. According to this aspect, redundancy is estimated by iteratively subtracting the $f_{ij}$ of each next most important cooler one at a time until the CI drops below acceptable standards The cooling redundancy of the given rack in N+(the number of coolers dropped). Alternatively, and equivalently, redundancy is estimated by iteratively adding the $f_{ij}$ of the cooler having the smallest remaining contribution, progressing towards those with larger contributions, until an acceptable total CI is achieved, and then noting the number of coolers left out from the summation. The cooling redundancy is then reported as N+(the number of coolers left out of the sum), which is equivalent to N+(the number of coolers dropped) used in the prior alternative. Cold aisle CI redundancy is calculated similarly using $g_{ij}$.

This approach assumes that there is no surplus cooling available to the rack; that is, for a given rack, i, the simple $f_{ij}$ must sum over j and can be no greater than 1. If a room consists of only one rack cooled by two in-row cooling units, with 50% of the rack's air supplied from each unit, would turning off either in-row unit necessarily cause the rack to be poorly cooled? No, not necessarily, and aspects of the method make good redundancy estimates in these situations. In addition to $f_{ij}$ and $g_{ij}$, the method uses an estimate of surplus cooling, s, around each rack. The surplus cooling estimate, s, simulates, when a cooler fails or is shut down, how much additional airflow the remaining coolers can supply/collect for rack i. Redundancy estimates for each rack are then made using the subtraction or summation method described above, using s·$f_{ij}$ values instead of $f_{ij}$, until the sum of included s·$f_{ij}$ reaches the desired cooling index threshold.

The value of s enables quick computation of redundancy estimates for a large variety of airflow estimation methods. Using an algebraic calculator such as disclosed in U.S. patent application Ser. No. 12/019,109, filed Jan. 24, 2008, for example that of the release of InfraStruxure Designer and Operations Manager current at the filing date of this application, the value of the surplus cooling s is easily found within the computations already performed. For other estimation methods, such as CFD, s is not readily available, but the value of s may be computed by one of the methods discussed below, or other suitable methods.

Hot Aisle Capture Index
The hot aisle capture index (HACI) for each rack i is computed as:

$$HACI_i = \sum_{j=1}^{n^H} f_{ij},$$

where $n^H$ is the number of cooling sinks (i.e. coolers drawing in hot air) on the hot aisle.

Cold Aisle Capture Index
The cold aisle cap index (CACI) for each rack i is computed as:

$$CACI_i = \sum_{j=1}^{n^C} g_{ij},$$

where $n^C$ is the number of cooling sources (i.e. coolers emitting cold air) on the cold aisle.

Sorting $f_{ij}$ and $g_{ij}$
Employing aspects of an embodiment, there is no need to run the solver up to $2^n$ times to simulate all of the different possible combinations of on/off cooling units. Modeling of the turning off of cooling units having the largest impact on air flow at the rack is sufficient.

Consider a hot aisle of a layout. For each rack i, the $f_{ij}$'s are sorted by magnitude, in effect ranking the coolers from greatest to least effect on the rack's HACI. If $n^H$ is the number of cooling sinks on the hot aisle, let $f_{i,(l)}$ denote the lth smallest value of $f_{ij}$ for rack i, such that $$f_{i,(1)} \leq f_{i,(2)} \leq f_{i,(3)} \leq \ldots \leq f_{i,(n^H)}.$$

Therefore, the cooler whose shutdown would most hurt the HACI of rack i is the cooler having the largest $f_{ij}$. Similarly, for two or more coolers, the two or more cooling units with the largest $f_{ij}$'s would produce the worst-case scenario for rack i.

In the cold aisle, the contribution of tile airflow should be accounted for but the idea remains the same. When there are multiple CRAC units, the failure of any one CRAC should not reduce the tile airflow to zero. However, this can be remedied by modeling the individual tiles as the cooling sources (instead of the CRACs themselves) and approximating that each tile receives an even share of airflow from each CRAC.

For each rack i, the $g_{ij}$'s are sorted by magnitude, ranking the cooling sources from least to greatest effect on the rack's CACI. If $n^C$ is the number of cooling sources, let $g_{i,(l)}$ denote the lth smallest value of $g_{ij}$ for rack i, such that $$g_{i,(1)} \leq g_{i,(2)} \leq g_{i,(3)} \leq \ldots \leq g_{i,(n^C)}.$$

With this sorting, the cooling sources that have the most effect on the rack can be selected for modeling shutdowns.

Estimating the Coefficient of Surplus Cooling, s
Methods for computing the coefficient of surplus cooling, s, include, but are not limited to, the following four methods. The first relies on the algebraic calculator and the notion of "uncapped" $f_{ij}$ and $g_{ij}$. The final three methods should be helpful for general airflow estimates, and set the coefficient to global air ratio, aisle air ratio, or local aisle air ratio.

Method 1: Estimates with Algebraic Calculator
Estimating the coefficient of surplus cooling is simple in the algebraic cooling calculator. The algebraic calculator already has a built-in estimate of surplus cooling, namely the "uncapped" CI. In the algebraic calculator, $f_{ij}$ and $g_{ij}$ are estimated with regard to airflow magnitudes and distances between objects. However in the computations, there is no cap on values of $f_{ij}$, $g_{ij}$, and CI, which allows $f_{ij}$, $g_{ij}$, to take on any reasonable values and the resulting CI to be greater than 100%. If a rack's CI is greater than 100%, i.e., greater than 1, the calculator corrects by scaling all $f_{ij}$, $g_{ij}$, and CI by a factor of 1/CI. For the purposes of this exemplary method, however, the uncapped values of $f_{ij}$, $g_{ij}$, and CI, i.e., without applying the 1/CI scaling factor, are just what is required; s is then taken to have a value equal to the uncapped CI.

Methods 2, 3, and 4: General Estimates

While users of CFD may still use the algebraic calculator to estimate s, some embodiments may not implement an algebraic calculator. For those embodiments, at least these three methods, with good physical foundations, can be used to estimate s as follows:

1. Global air ratio of the room—The combined airflow of cooling units in the room divided by the airflow of rack units.

2. Air ratio of the hot/cold aisle—The combined airflow of cooling units in the rack's hot aisle or cold aisle divided by the airflow of rack units associated with the same aisle.

3. Local air ratio around the rack—The combined airflow of cooling units in the rack's hot aisle or cold aisle divided by the airflow of rack units in the particular aisle within a certain distance of the target rack. Another possible approach might consider all rack and cooler airflows, but weight each in the estimate by proximity to the target rack.

The local estimates should be closer to representing the true surplus available to a specific rack.

Using Hot Aisle CI and Cold Aisle CI to Compute Redundancy

Some exemplary embodiments are described below, presenting several methods combining the above techniques for computing redundancy. Other combinations and variations of these techniques are also contemplated as within the scope of the invention, as will be evident upon reading these examples.

Since racks have both a hot aisle and a cold capture index (HACI and CACI), there may be several ways to incorporate the CIs into an evaluation of the cooling performance for a rack.

Consider five possible situations when incorporating hot and cold aisle CI in an evaluation: use only hot aisle CI, use only cold aisle CI, use a linear combination of hot aisle and cold aisle CI, use the maximum of hot aisle CI and cold aisle CI, and use the minimum of hot aisle CI and cold aisle CI. Other functions of hot aisle CI and cold aisle CI could be constructed and similar analysis could be performed to calculate redundancy.

Redundancy for Hot Aisle Capture Index

The main factors are $n^H$, $f_{ij}$, and $s^H$. The redundancy N+R is the number of coolers, R, that can be shut down, for which HACI remains at or above an acceptable threshold for rack i. The group of shut-down coolers includes only those whose $f_{ij}$ values are greater than or equal to the $f_{ij}$ value of any cooler not shut down.

An exemplary method, 300, of computing redundancy based on HACI is shown in FIG. 3, now described. The method is initialized by first calculating $f_{ij}$ for each rack, i, and cooler j, step 301. Also during initialization, the index, i, denoting each rack, as used throughout this description, is initialized to 1, step 301. An iteration loop including steps 302-309 is now performed as follows. For rack i, sort the values of $f_{ij}$ from smallest to largest, as described above, step 302. Also calculate the cooling surplus $s^H$, step 303, and set the threshold for CI, x, and a counter k=0, step 304. A summation is incrementally tested in steps 305 and 306. This summation consists of $f_{i(j)}$ values, with the index j taking on integer values from 1 to $n^H$-k. If the summation reaches a value that falls below the threshold, x, for CI, the value N+k−1 is reported to be the redundancy, unless k=0 which is reported as "uncovered" or "inadequate" cooling, step 307. Otherwise, k is incremented and the summation is tested against the threshold again. When a report is given, step 307, for a rack, i, then i is incremented, step 308, and if i is still less than the number of racks, N, then processing returns to step 302, otherwise processing ends.

Redundancy for Cold Aisle Capture Index

The main factors are $n^C$, $g_{ij}$, and $s^C$. The redundancy N+R is the number, R, of coolers that can be shut down, for which CACI remains at or above an acceptable threshold for rack i. The group of shut down coolers includes only those whose $g_{ij}$ values are greater than or equal to the $g_{ij}$ value of any cooler not shut down.

Figure 4:
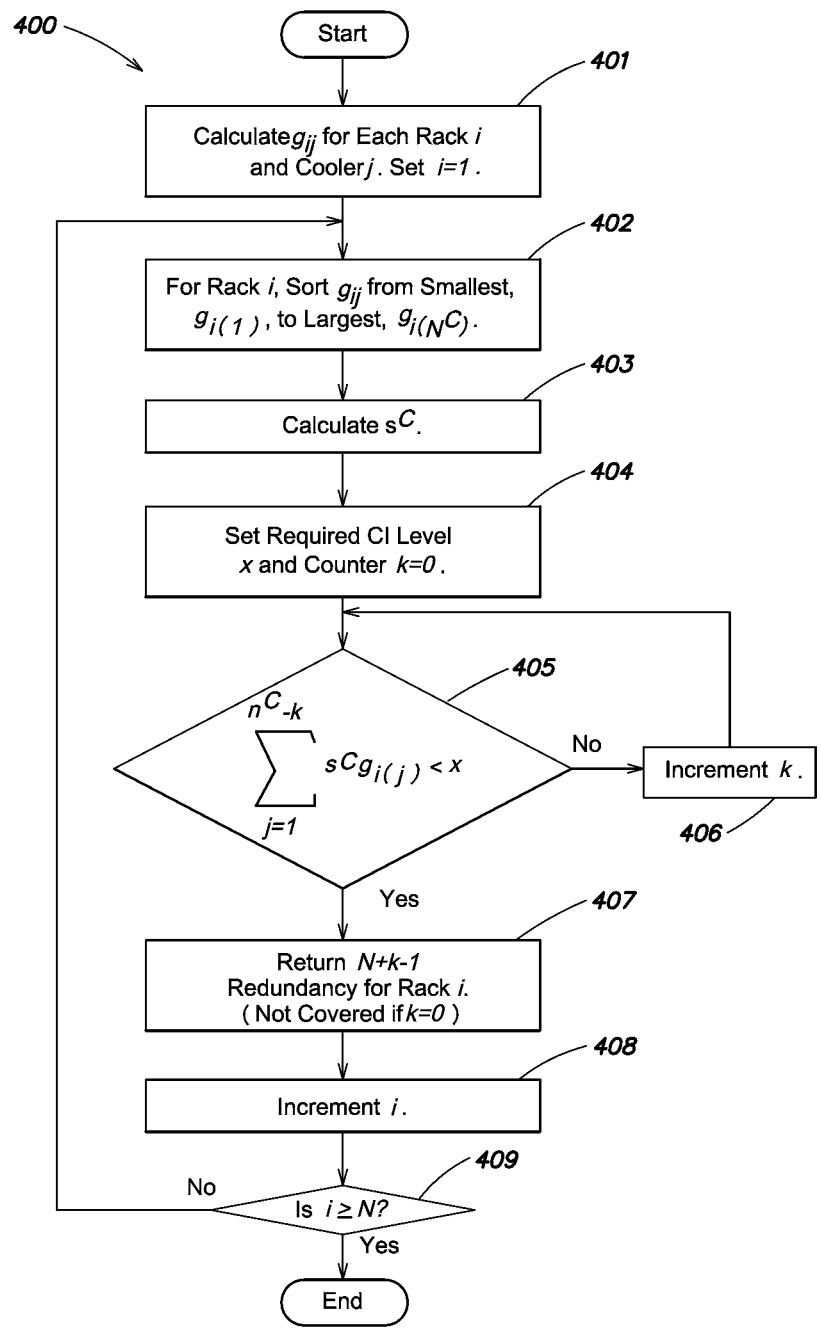
FIG. 4 depicts a second aspect of an example process for designing a data center configuration according to an embodiment.

An exemplary method, 400, of computing redundancy based on CACI is shown in FIG. 4, now described. The method is initialized by first calculating $g_{ij}$ for each rack, i, and cooler j, step 401. Also during initialization, the index, i, denoting each rack, as used throughout this description, is initialized to 1, step 401. An iteration loop including steps 402-409 is now performed as follows. For rack i, sort the values of $g_{ij}$ from smallest to largest, as described above, step 402. Also calculate the cooling surplus $s^C$, step 403, and set the threshold for CI, x, and a counter k=0, step 404. A summation is incrementally tested in steps 405 and 406. This summation consists of $g_{i(j)}$ values, with the index j taking on integer values from 1 to $n^C$-k. When the summation reaches a value that falls below the threshold, x, for CI, the value N+k−1 is reported to be the redundancy, unless k=0 which is reported as "uncovered" or "inadequate" cooling, step 407. Otherwise, k is incremented and the summation is tested against the threshold again. When a report is given, step 407, for a rack, i, then i is incremented, step 408, and if i is still less than the number of racks, N, then processing returns to step 402, otherwise processing ends.

Redundancy for Linear Combinations of the Two Capture Indices

Figure 5:
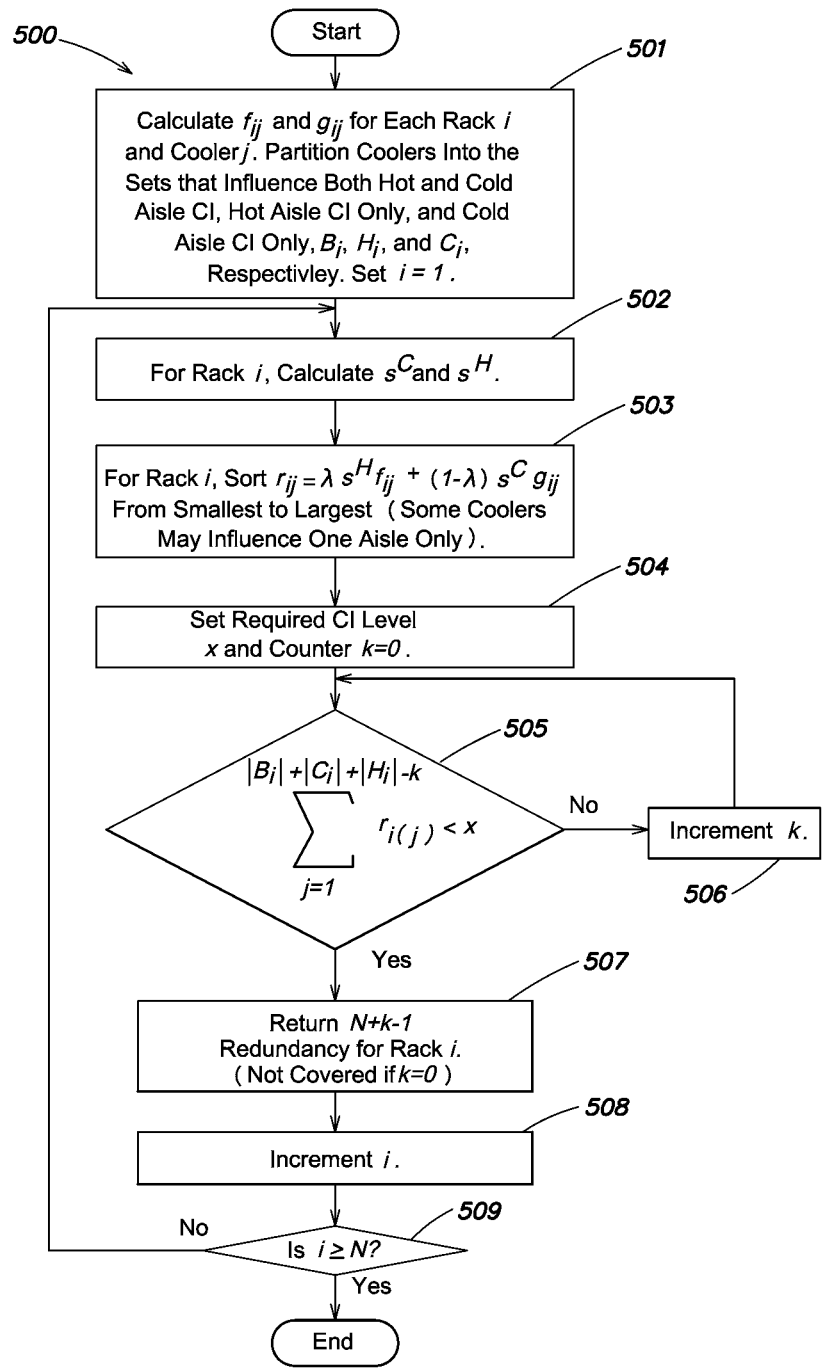
FIG. 5 shows a third aspect of an example process for designing a data center configuration according to an embodiment.

The main factors are $n^H$, $f_{ij}$, $s^H$, $n^C$, $g_{ij}$, and $s^C$. This method is illustrated by FIG. 5, described next.

For each rack, the coolers are divided into three sets: $H_i$=cooling units that only affect the hot aisle side, $C_i$=cooling units that only affect the cold aisle side, and $B_i$=cooling units that affect both sides (commonly, the $B_i$ group includes in-row units, in the same row as the rack), step 501. Also, an index, i, representing the racks is initialized to a value of 1, step 501. The method proceeds in a similar fashion to the two forgoing methods. For the rack designated i, the cooling surpluses on the hot and cold aisles, $s^H$ and $s^C$, respectively, are computed, step 502. The contributions of the groups are linearly weighted. If the weight of the hot aisle capture index is denoted by λ and the weight of the cold aisle capture index is 1−λ, then the primary factors are $\lambda f_{ij}s^H$ and $(1-\lambda)g_{ij}s^C$. For cooler j in $H_i$, the overall weight would be $r_{ij}=\lambda f_{ij}s^H$. For cooler j in $C_i$, the weight would be $r_{ij}=(1-\lambda)g_{ij}s^C$. And for cooler j in $B_i$, the weight would be $r_{ij}=\lambda f_{ij}s^H+(1-\lambda)g_{ij}s^C$. For the rack designated i, combined cooling contributions, $r_{ij}$ are sorted from smallest to largest, step 503. Set the threshold for CI, x, and a counter k=0, step 504. A summation is incrementally tested in steps 505 and 506. This summation consists of $r_{i(j)}$ values, with the index j taking integer values from 1 to $|B_i|+|C_i|+|H_i|-k$. When the summation reaches a value that falls below the threshold, x, for CI, the value N+k−1 is reported to be the redundancy, unless k=0 which is reported as "uncovered" or "inadequate" cooling, step 507. Otherwise, k is incremented and the summation is tested against the threshold again. When a report is given, step 507, for a rack, i, then i is incremented, step 508, and if i is still less than the number of racks, N, then processing returns to step 502, otherwise processing ends.

Redundancy for Maximum of Hot Aisle and Cold Aisle Capture Indices

If the user evaluates the cooling performance as the maximum of the two capture indices, the computation of overall redundancy may not be simple. In general, the overall redundancy does not have to be the maximum of the hot aisle redundancy and the cold aisle redundancy. If this computation of overall redundancy is desired, it may be computed by the method shown in FIGS. 6A and 6B, and described below.

The framework of this method 600 is similar to the preceding three exemplary methods. Indeed, steps 601, 602, 603, 604, 607, 608, and 609 are analogous to counterparts in FIGS. 3, 4, and 5, designated by corresponding reference numerals x01, x02, x03, x04, x07, x08, and x09, where x is the figure number, except step 602 is analogous to step 503 and step 603 is analogous to step 502.

Utilizing the same notation as the preceding method, again divide the coolers into three sets: $H_i$, $C_i$, and $B_i$.

Generally, the redundancy for rack i is the solution to a so-called knapsack problem. Knapsack problems are a type of problem in combinatorial optimization that are well-known and are difficult to solve in general. Many solution techniques are available through dynamic programming, greedy approximation methods, genetic algorithms, and other heuristic search algorithms.

In the knapsack formulation for the redundancy estimate, $y_j$ is an indicator. The value $y_j=1$ indicates that cooler j is turned off and $y_j=0$ indicates that cooler j is turned on. Thus, redundancy is estimated by finding the minimum number of turned-off coolers that cause both CI's to fall below a given threshold, x:

$$\min \sum_{j \in B_i} y_j + \sum_{j \in H_i \cup C_i} y_j \text{ such that}$$

$$\sum_{j \in B_i} s^H f_{ij}(1-y_j) + \sum_{j \in H_i} s^H f_{ij}(1-y_j) \leq x,$$

$$\sum_{j \in B_i} s^C g_{ij}(1-y_j) + \sum_{j \in C_i} s^C g_{ij}(1-y_j) \leq x, \text{ and}$$

$$y_j \in \{0,1\} \forall j \in B_i \cup C_i \cup H_i.$$

Figure 6B:
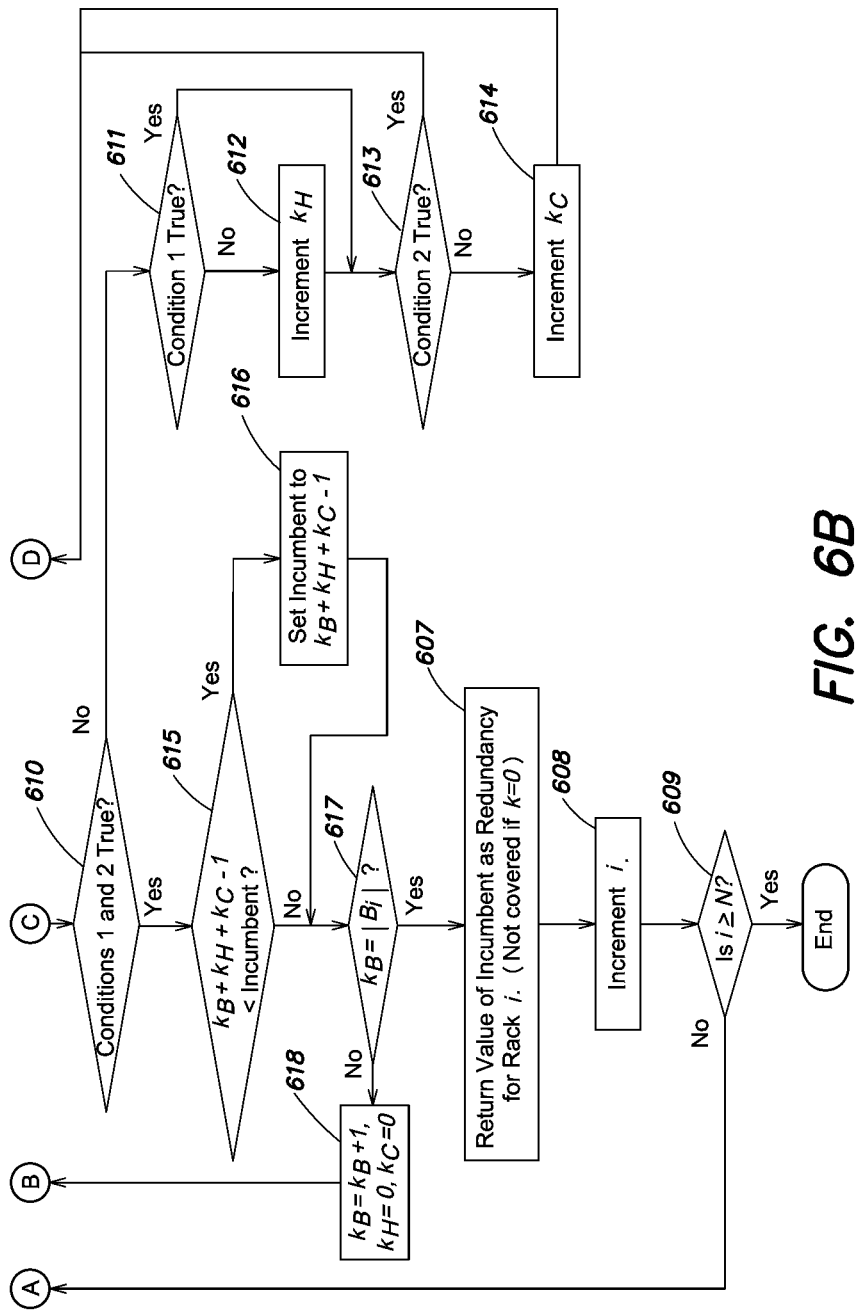

The special case for which a solution method is available that can be performed using algebraic calculators such as available in the InfraStruxure suite is that which is illustrated now in connection with FIGS. 6A and 6B. This method depends on the following condition:

Within set $B_i$ (coolers that affect both rows), the relative importance of coolers is the same for hot aisles and cold aisle. In other words, the condition for solving the knapsack problem using this illustrative method is that the cooler with the largest $f_{ij}$ within $B_i$ also happens to be the cooler with the largest $g_{ij}$ within $B_i$, and that the cooler with the second largest $f_{ij}$ also happens to be the cooler with the second largest $g_{ij}$ within $B_i$, and so on.

When this condition applies to a layout, a method to determine redundancy is performed as shown in FIGS. 6A and 6B. If this condition does not hold, the general knapsack methods previously mentioned should be considered.

As in the other methods illustrated, firstly $f_{ij}$ and $g_{ij}$ are computed for each rack i and cooler j, step 601. Also, the index of racks, i, is initialized to a value of 1, step 601. Next, for rack i, the $f_{ij}$ and $g_{ij}$ are sorted, within each of the groups $H_i$, $C_i$, and $B_i$, step 602, as in the previous methods. Values for the surplus cooling available, $s^H$ and $s^C$ are computed, step 603. A threshold level, x, is set for the required CI. Counters $k_H=0$, $k_C=0$, and $k_B=0$, along with incumbent=the number of available coolers are initialized, step 604.

The next set of steps, which are embedded in incremental loops, are performed based on the result of applying Condition 1 and Condition 2 to the values computed above and the values of the counters as the various loops are traversed. First, a test determines whether both Condition 1 and Condition 2 are currently met, step 610. If not, tests determine whether either Condition 1, step 611, or Condition 2, step 613, are individually met. If Condition 1 is not met, then $k_H$ is incremented, step 612; and if Condition 2 is not met, then $k_C$ is incremented, step 614. After steps 611, 612, 613, and 614 complete, control returns to step 610. If the test at step 610 is met, then another test determines whether $k_H+k_C+k_B-1<$incumbent, step 615. If the test of step 615 is met, then incumbent is set to $k_H+k_C+k_B-1$, step 616. Next, whether the test at 615 has been met or not, a test determines whether $k_B=|B_i|$, step 617. If the test at 617 fails, then $k_B$ is incremented by 1, while $k_H$ is set to 0 and $k_C$ is set to 0, step 618, whereupon control returns to step 610. Otherwise, if the test at 617 is met, then, at step 607, the value of incumbent is returned as the redundancy for rack i; unless k=0, in which case the rack is not covered, i.e., the rack has inadequate cooling. The rack index, i, is then incremented, step 608, and a test, step 609, returns control to step 602 if i is less than N, the number of racks.

Redundancy for Minimum of Hot Aisle and Cold Aisle Capture Indices

If the user evaluates the cooling performance with the minimum of the two capture indices, then the redundancy of this rack would be the minimum of the hot aisle redundancy and the cold aisle redundancy.

An Example of Computing HACI Redundancy

Figure 7:
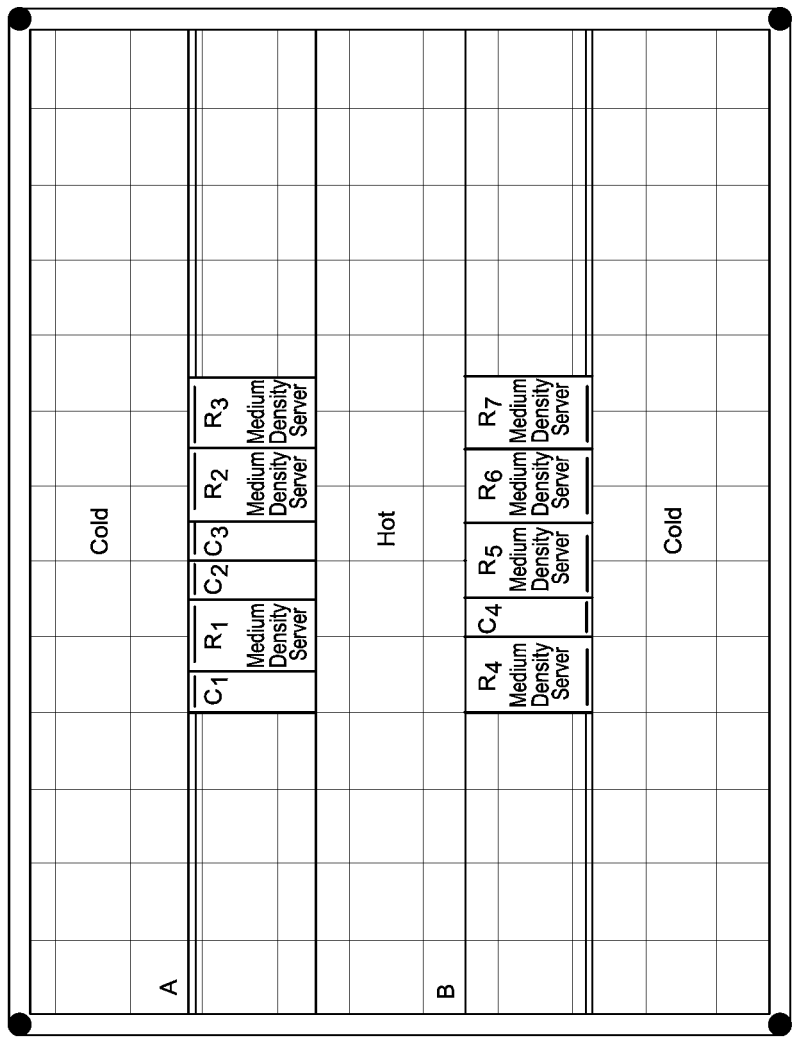
FIG. 7 shows a layout in connection with which an example of carrying out the process of FIG. 3 is described.

A numerical example of an exemplary method for computing hot aisle capture index redundancy using the algebraic calculator is now given, with respect to the layout shown in FIG. 7. For the purpose of these computations, the coolers are numbered in order from left to right, starting with the top row and proceeding down to the bottom row. Thus the objects of row A are identified as: cooler $C_1$, rack $R_1$, cooler $C_2$, cooler $C_3$, rack $R_2$, rack $R_3$. In row B, the objects are identified as: rack $R_4$, cooler $C_4$, rack $R_5$, rack $R_6$, and rack $R_7$.

Consider the hot aisle redundancy computation for rack 2, making reference to the flowchart of FIG. 3. Rack $R_2$ starts with a real CI of 1, so it is adequately cooled. The surplus cooling coefficient, s, for rack $R_2$ is 1.54, and the acceptable level for adjusted CI, i.e., the CI threshold, is deemed to be 0.90. (Refer to FIG. 3, steps 301-304.) Since the adjusted CI is s·CI=1.54, a cooling capacity of up to 0.64 may be lost through shut down or failure before the adjusted CI falls below the acceptable level of 0.90 in this example. The two cooling units with the largest effect on rack $R_2$ is cooler $C_3$, which carries a weight of to 0.41·1.54=0.63, and cooler $C_2$, which carries a weight of 0.32·1.54=0.49. Removing cooler $C_3$ just barely keeps the rack $R_2$ above the acceptable limit, while removing coolers $C_2$ and $C_3$ will leave the rack inadequately cooled. (Refer to FIG. 3, steps 305-307.)

A similar analysis is performed for the other racks (and for the other aisle). (Refer to FIG. 3, steps 308, 309, and the result of performing the iteration directed by those steps.) Some racks (e.g., rack $R_1$ and rack $R_2$) have a very high coefficient of surplus cooling, while others (e.g., rack $R_7$) do not. A high coefficient of surplus cooling usually corresponds to a higher computed redundancy, but sometimes the rack's airflow is dominated by only one, very powerful, cooling unit, resulting in a lower redundancy than might be expected in view only of the surplus cooling apparently available. The complete analysis result is given in FIG. 8.

Any references to front and back, left and right, top and bottom, and upper and lower are intended for convenience of description, not to limit the present systems and methods or their components to any one positional or spatial orientation.

Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements.

Any embodiment disclosed herein may be combined with any other embodiment, and references to "an embodiment," "some embodiments," "an alternate embodiment," "various embodiments," "one embodiment," "at least one embodiment," "this and other embodiments" or the like are not necessarily mutually exclusive and are intended to indicate that a particular feature, structure, or characteristic described in connection with the embodiment may be included in at least one embodiment. Such terms as used herein are not necessarily all referring to the same embodiment. Any embodiment may be combined with any other embodiment in any manner consistent with the aspects disclosed herein. References to "or" may be construed as inclusive so that any terms described using "or" may indicate any of a single, more than one, and all of the described terms.

Where technical features in the drawings, detailed description or any claim are followed by references signs, the reference signs have been included for the sole purpose of increasing the intelligibility of the drawings, detailed description, and claims. Accordingly, neither the reference signs nor their absence have any limiting effect on the scope of any claim elements.

Having now described some illustrative aspects of the invention, it should be apparent to those skilled in the art that the foregoing is merely illustrative and not limiting, having been presented by way of example only. Similarly, aspects of the present invention may be used to achieve other objectives including allowing users to design facilities other than data centers which may benefit from effective and efficient cooling systems. For example, according to one embodiment, users may design food preparation facilities, food storage facilities, manufacturing facilities and other facilities that may benefit from assured cooling redundancy levels. Numerous modifications and other illustrative embodiments are within the scope of one of ordinary skill in the art and are contemplated as falling within the scope of the invention. In particular, although many of the examples presented herein involve specific combinations of method acts or system elements, it should be understood that those acts and those elements may be combined in other ways to accomplish the same objectives.

What is claimed is:

1. A computer-implemented method of determining cooling redundancy information, comprising:
    modeling in a computer a location having plural racks of equipment to be cooled by a plurality of coolers;
    for each rack:
        computing a fraction of the rack's airflow handled by a cooler;
        sorting by magnitude over the plurality of coolers one or more computed fractions including each computed fraction of the rack's airflow handled by a cooler;
        computing a surplus cooling factor;
        multiplying at least one of the one or more computed fractions by the surplus cooling factor to generate a modified computed fraction;
        computing a sum by adding the one or more modified computed fractions from smallest to largest until a cooling index for the rack is adequate, while keeping a count of coolers whose modified computed fractions are not included in the sum; and
    reporting redundancy as a value determined by the count.

2. The method of claim 1, wherein computing the fraction further comprises computing the fraction of the rack's hot airflow output captured by a cooler.

3. The method of claim 1, wherein computing the fraction further comprises computing the fraction of the rack's cold airflow input provided by a cooler.

4. The method of claim 1, wherein computing the fraction further comprises:
    computing the fraction of the rack's cold airflow input provided by a cooler on a cold aisle adjacent the rack; and
    computing the fraction of the rack's hot airflow output captured by a cooler on a hot aisle adjacent the rack; and
    further comprising:
    performing the sorting separately for the one or more computed fractions of the rack's cold airflow input and the one or more computed fractions of the rack's hot airflow output;
    performing the computing of the sum separately for the one or more modified computed fractions of the rack's cold airflow input and the one or more modified computed fractions of the rack's hot airflow output; and
    further wherein the value determined by the count is based on a linear combination of the one or more modified computed fractions of the rack's cold airflow input and the one or more modified computed fractions of the rack's hot airflow output.

5. The method of claim 1, wherein computing the fraction further comprises:
    computing the fraction of the rack's cold airflow input provided by a cooler on a cold aisle adjacent the rack; and
    computing the fraction of the rack's hot airflow output captured by a cooler on a hot aisle adjacent the rack; and
    further comprising:
    performing the sorting separately for the one or more computed fractions of the rack's cold airflow input and the one or more computed fractions of the rack's hot airflow output;
    performing the computing of the sum separately for the one or more modified computed fractions of the rack's cold airflow input and the one or more modified computed fractions of the rack's hot airflow output; and
    further wherein the value determined by the count is based on a maximum of at least one modified computed fraction of the one or more computed fractions of the rack's cold airflow input and the one or more modified computed fractions of the rack's hot airflow output.

6. The method of claim 1, wherein computing the fraction further comprises:
- computing the fraction of the rack's cold airflow input provided by a cooler on a cold aisle adjacent the rack; and
- computing the fraction of the rack's hot airflow output captured by a cooler on a hot aisle adjacent the rack; and further comprising:
- performing the sorting separately for the one or more computed fractions of the rack's cold airflow input and the one or more computed fractions of the rack's hot airflow output;
- performing the computing of the sum separately for the one or more modified computed fractions of the rack's cold airflow input and the one or more modified computed fractions of the rack's hot airflow output; and
- further wherein the value determined by the count is based on a minimum of the one or more modified computed fractions of the rack's cold airflow input and the one or more modified computed fractions of the rack's hot airflow output.

7. A computer-implemented apparatus for determining cooling redundancy information, comprising:
- a computer storage system in which is held a numerical computer model representing a location having plural racks of equipment to be cooled by a plurality of coolers; and
- a computer processor executing a sequence of instructions directing:
  - for each rack represented in the numerical computer model:
    - computing a fraction of the rack's airflow handled by a cooler;
    - sorting by magnitude over the plurality of coolers one or more computed fractions including each computed fraction of the rack's airflow handled by a cooler;
    - computing a surplus cooling factor;
    - multiplying at least one of the one or more computed fractions by the surplus cooling factor to generate a modified computed fraction;
    - computing a sum by adding the one or more modified computed fractions from smallest to largest until a cooling index for the rack is adequate, while keeping a count of coolers whose modified computed fractions are not included in the sum; and
  - reporting redundancy as a value determined by the count.

8. The apparatus of claim 7, wherein computing the fraction further comprises computing the fraction of the rack's hot airflow output captured by a cooler.

9. The apparatus of claim 7, wherein computing the fraction further comprises computing the fraction of the rack's cold airflow input provided by a cooler.

10. The apparatus of claim 7, wherein computing the fraction further comprises:
- computing the fraction of the rack's cold airflow input provided by a cooler on a cold aisle adjacent the rack; and
- computing the fraction of the rack's hot airflow output captured by a cooler on a hot aisle adjacent the rack; and
- further comprising the computer processor executing a sequence of instructions directing:
  - performing the sorting separately for the one or more computed fractions of the rack's cold airflow input and the one or more computed fractions of the rack's hot airflow output;
  - performing the computing of the sum separately for the one or more modified computed fractions of the rack's cold airflow input and the one or more modified computed fractions of the rack's hot airflow output; and
- further wherein the value determined by the count is based on a linear combination of the one or more modified computed fractions of the rack's cold airflow input and the one or more modified computed fractions of the rack's hot airflow output.

11. The apparatus of claim 7, wherein computing the fraction further comprises:
- computing the fraction of the rack's cold airflow input provided by a cooler on a cold aisle adjacent the rack; and
- computing the fraction of the rack's hot airflow output captured by a cooler on a hot aisle adjacent the rack; and
- further comprising the computer processor executing a sequence of instructions directing:
  - performing the sorting separately for the one or more computed fractions of the rack's cold airflow input and the one or more computed fractions of the rack's hot airflow output;
  - performing the computing of the sum separately for the one or more modified computed fractions of the rack's cold airflow input and the one or more modified computed fractions of the rack's hot airflow output; and
- further wherein the value determined by the count is based on a maximum of at least one modified computed fraction of the one or more modified computed fractions of the rack's cold airflow input and the one or more modified computed fractions of the rack's hot airflow output.

12. The apparatus of claim 7, wherein computing the fraction further comprises:
- computing the fraction of the rack's cold airflow input provided by a cooler on a cold aisle adjacent the rack; and
- computing the fraction of the rack's hot airflow output captured by a cooler on a hot aisle adjacent the rack; and
- further comprising the computer processor executing a sequence of instructions directing:
  - performing the sorting separately for the one or more computed fractions of the rack's cold airflow input and the one or more computed fractions of the rack's hot airflow output;
  - performing the computing of the sum separately for the one or more modified computed fractions of the rack's cold airflow input and the one or more modified computed fractions of the rack's hot airflow output; and
- further wherein the value determined by the count is based on a minimum of the one or more modified computed fractions of the rack's cold airflow input and the one or more modified computed fractions of the rack's hot airflow output.

13. A non-transitory computer readable medium having stored thereon sequences of instruction including instructions that will cause a processor to:
- model in a computer a location having plural racks of equipment to be cooled by a plurality of coolers;
- for each rack:
- compute a fraction of the rack's airflow handled by a cooler;
- sort by magnitude over the plurality of coolers one or more computed fractions including each computed fraction of the rack's airflow handled by a cooler;
- compute a surplus cooling factor;
- multiply at least one of the one or more computed fractions by the surplus cooling factor to generate a modified computed fraction;

compute a sum by adding the one or more modified computed fractions from smallest to largest until a cooling index for the rack is adequate, while keeping a count of coolers whose modified computed fractions are not included in the sum; and report redundancy as a value determined by the count.

14. The non-transitory computer readable medium of claim 13, wherein computing the fraction further comprises computing the fraction of the rack's hot airflow output captured by a cooler.

15. The non-transitory computer readable medium of claim 13, wherein computing the fraction further comprises computing the fraction of the rack's cold airflow input provided by a cooler.

16. The non-transitory computer readable medium of claim 13, wherein computing the fraction further comprises:

computing the fraction of the rack's cold airflow input provided by a cooler on a cold aisle adjacent the rack; and computing the fraction of the rack's hot airflow output captured by a cooler on a hot aisle adjacent the rack; and further comprising:

performing the sorting separately for the one or more computed fractions of the rack's cold airflow input and the one or more computed fractions of the rack's hot airflow output;

performing the computing of the sum separately for the one or more modified computed fractions of the rack's cold airflow input and the one or more modified computed fractions of the rack's hot airflow output; and further wherein the value determined by the count is based on a linear combination of the one or more modified computed fractions of the rack's cold airflow input and the one or more modified computed fractions of the rack's hot airflow output.

17. The non-transitory computer readable medium of claim 13, wherein computing the fraction further comprises:

computing the fraction of the rack's cold airflow input provided by a cooler on a cold aisle adjacent the rack; and computing the fraction of the rack's hot airflow output captured by a cooler on a hot aisle adjacent the rack; and further comprising:

performing the sorting separately for the one or more computed fractions of the rack's cold airflow input and the one or more computed fractions of the rack's hot airflow output;

performing the computing of the sum separately for the one or more modified computed fractions of the rack's cold airflow input and the one or more modified computed fractions of the rack's hot airflow output; and further wherein the value determined by the count is based on a maximum of at least one modified computed fraction of the one or more modified computed fractions of the rack's cold airflow input and the one or more modified computed fractions of the rack's hot airflow output.

18. The non-transitory computer readable medium of claim 13, wherein computing the fraction further comprises:

computing the fraction of the rack's cold airflow input provided by a cooler on a cold aisle adjacent the rack; and computing the fraction of the rack's hot airflow output captured by a cooler on a hot aisle adjacent the rack; and further comprising:

performing the sorting separately for the one or more computed fractions of the rack's cold airflow input and the one or more computed fractions of the rack's hot airflow output;

performing the computing of the sum separately for the one or more modified computed fractions of the rack's cold airflow input and the one or more modified computed fractions of the rack's hot airflow output; and further wherein the value determined by the count is based on a minimum of the one or more modified computed fractions of the rack's cold airflow input and the one or more modified computed fractions of the rack's hot airflow output.

* * * * *